United States Patent
Karmous

(10) Patent No.: US 10,707,085 B2
(45) Date of Patent: Jul. 7, 2020

(54) DISHING PREVENTION STRUCTURES AND RELATED METHODS FOR SEMICONDUCTOR DEVICES

(71) Applicant: Infineon Technologies Austria AG, Villach (AT)

(72) Inventor: Alim Karmous, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/914,435

(22) Filed: Mar. 7, 2018

(65) Prior Publication Data
US 2019/0279875 A1    Sep. 12, 2019

(51) Int. Cl.
| | |
|---|---|
| *H01L 21/306* | (2006.01) |
| *H01L 21/308* | (2006.01) |
| *H01L 21/321* | (2006.01) |
| *H01L 21/3105* | (2006.01) |
| *H01L 29/73* | (2006.01) |
| *H01L 29/861* | (2006.01) |

(Continued)

(52) U.S. Cl.
CPC .... *H01L 21/30625* (2013.01); *H01L 21/3083* (2013.01); *H01L 21/31053* (2013.01); *H01L 21/3212* (2013.01); *H01L 29/7317* (2013.01); *H01L 29/861* (2013.01); *H01L 21/76202* (2013.01); *H01L 21/76224* (2013.01); *H01L 28/20* (2013.01); *H01L 29/66128* (2013.01); *H01L 29/66136* (2013.01); *H01L 29/66265* (2013.01); *H01L 29/66742* (2013.01); *H01L 29/78603* (2013.01)

(58) Field of Classification Search
CPC .......... H01L 21/30625; H01L 21/3083; H01L 21/31053; H01L 21/3112
See application file for complete search history.

(56) References Cited

U.S. PATENT DOCUMENTS 5,362,669 A * 11/1994 Boyd ................ H01L 21/31053
438/437
5,459,096 A * 10/1995 Venkatesan ....... H01L 21/31053
148/DIG. 5

(Continued)

FOREIGN PATENT DOCUMENTS

KR    20020002925 A    1/2002

*Primary Examiner* — Zandra V Smith
*Assistant Examiner* — Andre C Stevenson
(74) *Attorney, Agent, or Firm* — Murphy, Bilak & Homiller, PLLC

(57) ABSTRACT

A method of manufacturing a semiconductor device includes: forming an isolation region comprising a dielectric material on a substrate; forming a recess in the isolation region, wherein a thickness of the isolation region is reduced but greater than zero in the recess; forming a fill layer or layer stack including at least one of a semiconductor or metal on the isolation region and which conforms to the recess; forming a dishing prevention layer or layer stack on the fill layer or layer stack and which conforms to the recess; planarizing the dishing prevention layer or layer stack and the fill layer or layer stack to confine the dishing prevention layer or layer stack and the fill layer or layer stack to the recess, wherein the planarizing stops on the isolation region outside the recess; and forming one or more electrical contacts to the fill layer or layer stack confined to the recess.

26 Claims, 6 Drawing Sheets

(51) Int. Cl.
*H01L 21/762* (2006.01)
*H01L 29/66* (2006.01)
*H01L 49/02* (2006.01)
*H01L 29/786* (2006.01)

(56) References Cited

U.S. PATENT DOCUMENTS

| | | | |
|---|---|---|---|
| 6,103,625 A * | 8/2000 | Marcyk | H01L 21/3212 |
| | | | 257/E21.304 |
| 6,169,028 B1 | 1/2001 | Wang et al. | |
| 2007/0093063 A1 | 4/2007 | Kim et al. | |
| 2014/0097539 A1 | 4/2014 | Zhang et al. | |
| 2017/0084526 A1* | 3/2017 | Lin | H01L 21/76879 |

\* cited by examiner

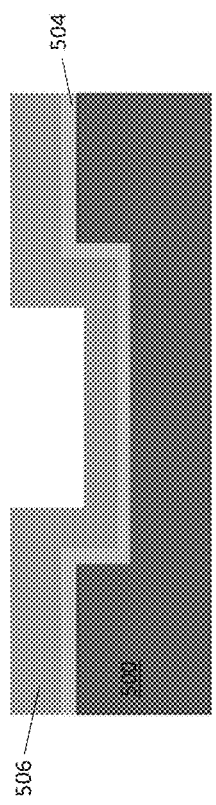
Figure 10D
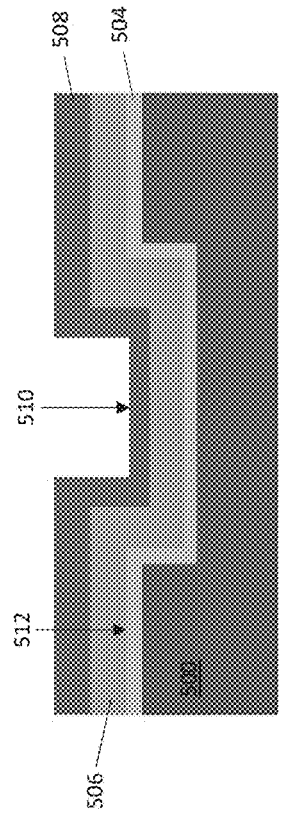
Figure 10E
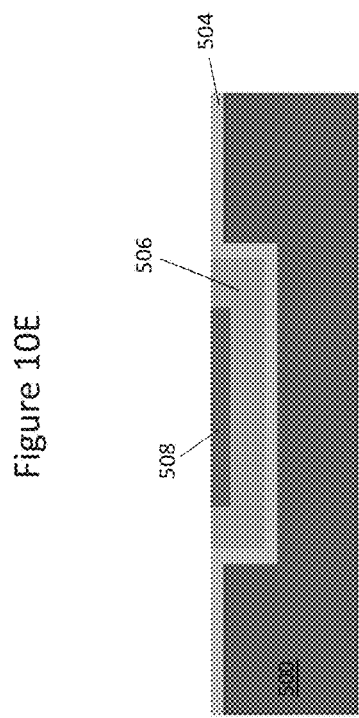
Figure 10F
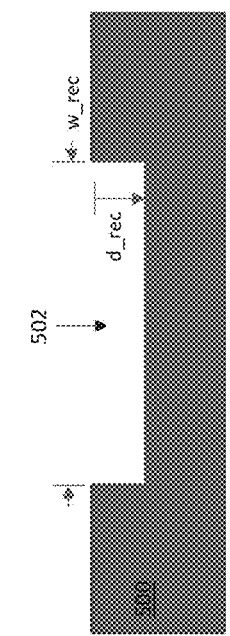
Figure 10A
Figure 10B
Figure 10C

DISHING PREVENTION STRUCTURES AND RELATED METHODS FOR SEMICONDUCTOR DEVICES

BACKGROUND

Chemical Mechanical Polishing/Planarization (CMP) is a technique widely employed in semiconductor manufacturing for planarizing a first layer (or a first layer stack) down to a second layer (or a second layer stack). In the case of structures with wide dimensions such as large metal pads, wide trenches, etc. dishing of the first layer (or first layer stack) occurs in such large structures. For example, an oxide CMP process with high selectivity of oxide to nitride may cause oxide dishing while over-polishing the oxide to form an STI (shallow trench isolation) or LOCOS (LOCal Oxidation of Silicon) structure. Dishing occurs when more material is removed from the center of the structure being planarized, and the cross-section view has the profile of a dish and thus a nonuniform thickness. It is desirable to minimize or at least reduce dishing when planarizing structures with wide dimensions.

SUMMARY

According to an embodiment of a method of manufacturing a semiconductor device, the method comprises: forming an isolation region comprising a dielectric material on a substrate; forming a recess in the isolation region, wherein a thickness of the isolation region is reduced but greater than zero in the recess; forming a fill layer or layer stack comprising at least one of a semiconductor or metal on the isolation region and which conforms to the recess; forming a dishing prevention layer or layer stack on the fill layer or layer stack and which conforms to the recess; planarizing the dishing prevention layer or layer stack and the fill layer or layer stack to confine the dishing prevention layer or layer stack and the fill layer or layer stack to the recess, wherein the planarizing stops on the isolation region outside the recess; and forming one or more electrical contacts to the fill layer or layer stack confined to the recess.

According to another embodiment of a method of manufacturing a semiconductor device, the method comprises; forming a recess in a substrate; forming an insulating layer on the substrate and which conforms to the recess; forming a fill layer or layer stack comprising at least one of a semiconductor or metal on the insulating layer and which conforms to the recess; forming a dishing prevention layer or layer stack on the fill layer or layer stack and which conforms to the recess; planarizing the dishing prevention layer or layer stack and the fill layer or layer stack to confine the dishing prevention layer or layer stack and the fill layer or layer stack to the recess, wherein the planarizing stops on the insulating layer outside the recess; and forming one or more electrical contacts to the fill layer or layer stack confined to the recess.

According to an embodiment of a semiconductor device, the semiconductor device comprises: a substrate; an isolation region comprising a dielectric material on the substrate; a recess in the isolation region: a semiconductor material confined to the recess; and an active or passive device formed in the semiconductor material and confined to the recess. A thickness of the isolation region is reduced but greater than zero in the recess.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments may be combined unless they exclude each other. Embodiments are depicted in the drawings and are detailed in the description which follows.

FIGS. 10A through 10F illustrate respective partial cross-sectional views of a dishing prevention structure during different stages of manufacturing a semiconductor device, according to another embodiment.

DETAILED DESCRIPTION

Embodiments described herein provide dishing prevention structures and related methods for manufacturing semiconductor devices. The dishing prevention structures and related methods described herein prevent or at least reduce dishing when planarizing structures with wide dimensions included in semiconductor devices.

FIGS. 1A through 1F illustrate an embodiment of a method of manufacturing a semiconductor device that includes planarizing a structure with wide dimensions. FIGS. 1A through 1F are partial cross-sectional views, with emphasis placed on the dishing prevention structure and related process steps, Other structures and devices included in the semiconductor device are out of view in FIGS. 1A through 1F for ease of illustration.

Figure 1C:
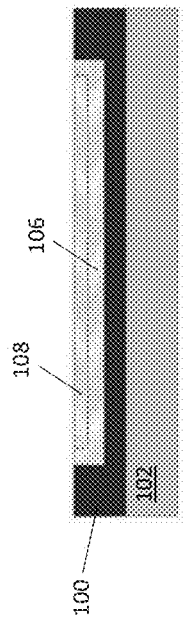
FIGS. 1A through 1F illustrate respective partial cross-sectional views of a dishing prevention structure during different stages of manufacturing a semiconductor device.
Figure 1D:
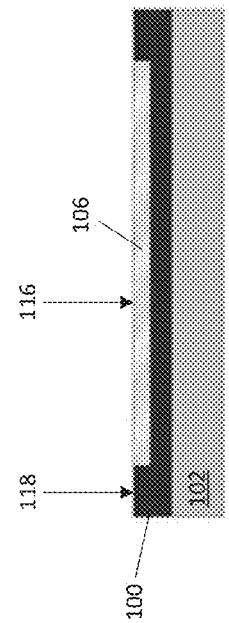
Figure 1A:
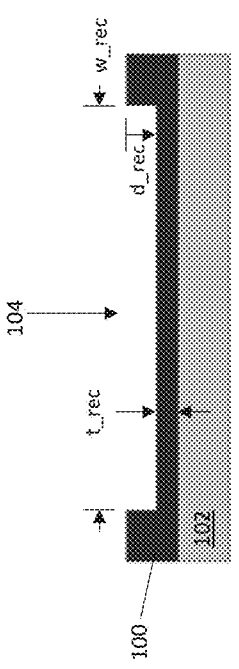

FIG. 1A shows an isolation region 100 comprising a dielectric material formed on a substrate 102. The isolation region 100 may be formed in a periphery or edge termination region of the substrate 102, or in other regions of the substrate 102. In some cases, the substrate 102 may be a semiconductor substrate. In other cases, the substrate 102 may be a glass substrate. Still other types of substrates may be used.

In the case of a semiconductor substrate, the substrate 102 may comprise any type of semiconductor material such as a single element semiconductor (e.g. Si, Ge, etc.), silicon-on-insulator, a binary semiconductor (e.g. SiC, GaN, GaAs, etc.), a ternary semiconductor, etc, with or without epitaxial layer(s). In the case of a Si substrate, the isolation region 100 may be a LOCOS region. LOCOS is a process that utilizes different rates of oxidation of silicon and silicon nitride. Silicon nitride masks regions where no oxidation should occur, and oxide only grows on bare Si. Since Si and silicon nitride have different coefficients of thermal expansion, a thin (pad) oxide layer is deposited between the Si substrate and the silicon nitride. For lateral isolation of transistors, a field oxide instead may be formed on the bare silicon surface. In each case, while the oxidation on the bare silicon takes place, a lateral diffusion of oxide occurs beneath the silicon nitride, resulting in a slight growth of oxide at the edge of the nitride mask which is a defining characteristic of a LOCOS region. In the case of Si or other types of semiconductor substrates, the isolation region 100 instead may be an STI (Shallow Trench Isolation) region which unlike a LOCOS region has no oxide field encroachment. Still other types of isolation regions may be used. For example, the isolation region 100 may be a silicon nitride isolation region in the case of a GaN substrate.

FIG. 1A also shows a recess 104 formed in the isolation region 100, e.g. using a standard etching process. The recess 104 has relatively large dimensions and thus would be prone to dishing after being filled, if a conventional planarization process were to be used. For example, the recess 104 may have a width (w_rec) above 50 μm, 50 to 100 μm, 300 μm or even wider. The depth (d_rec) of the recess 104 is less than the width, e.g. 100 nm to 2 μm, or deeper or shallower. The thickness (t_rec) of the isolation region 100 is reduced but greater than zero in the recess 104.

Common processing may result in one or more materials such as a gate electrode (e.g. made of doped polysilicon) being formed on the isolation region 100, including in the recess 104. These materials may be removed at least from the recess 104 using standard processing, so that the material to be planarized may be formed. In the case of a simple resistor, gate polysilicon may suffice as the resistor material. If so, the common gate polysilicon may remain in the recess 104 as the material to be planarized. Otherwise, it is removed from the recess 104.

Figure 1B:
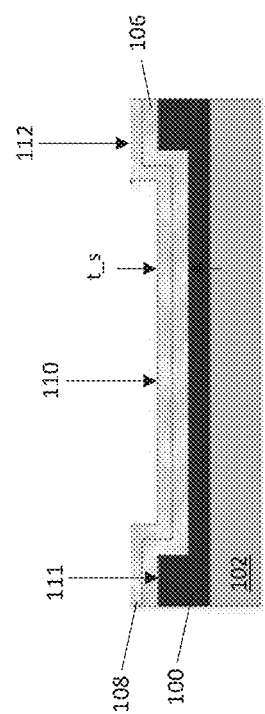

FIG. 1B shows a fill layer or layer stack 106 comprising at least one of a semiconductor or metal formed on the isolation region 100 and which conforms to the recess 104. In the case of a metal, one or more metal layers may be conformally deposited on the isolation region 100. For example, an aluminum metallization layer may be conformally deposited on the isolation region 100. In another example, a barrier layer, a seed layer and a copper metallization layer each may be conformally deposited on the isolation region 100. In the case of a semiconductor, the semiconductor material may be doped or undoped. The semiconductor may be doped in situ during conformal deposition on the isolation region 100, or subsequently doped. The semiconductor may have regions of different doping types in the recess 104 (e.g. n-type and p-type regions). The semiconductor may be low-doped edge termination polysilicon, amorphous silicon, highly doped polysilicon (e.g. of the kind used to form gate electrodes in other regions of the device), polysilicon-germanium, an epitaxial layer, etc.

FIG. 1B also shows a dishing prevention layer or layer stack 108 formed on the fill layer or layer stack 106 and which conforms to the recess 104 formed in the isolation region 100. As used herein, the term "dishing prevention layer or layer stack" means a material layer or stack of material layers that is configured to minimize or at least reduce dishing when planarizing structures with wide dimensions. In the case of the embodiment shown in FIGS. 1A through 1F, the dishing prevention layer or layer stack 108 minimizes or at least reduces dishing when planarizing the fill layer or layer stack 106 formed on the isolation region 100 and in the recess 104. In one embodiment, the dishing prevention layer or layer stack 108 comprises one or more of silicon oxide, silicon nitride and silicon oxynitride. The dishing prevention layer or layer stack 108 may comprise the same material as the isolation region 100, to function as an effective etch stop. In the case of planarization by CMP, the dishing prevention layer or layer stack 108 may comprise a material or combination of materials suitable as an effective etch stop for CMP. In one embodiment, the material 106 to be planarized and the dishing prevention layer or layer stack 108 are blanket deposited everywhere over the substrate 100.

In an embodiment, the combined thickness t_s of the fill layer or layer stack 106 and the dishing prevention layer or layer stack 108 is chosen such that the top (uppermost) surface 110 of the dishing prevention layer or layer stack 108 in the recess 104 may be coplanar or nearly coplanar with the top surface 111 of the isolation region 100 outside the recess 104. This way, post-planarization residue on both sides of the recess structure and inside the recess structure is minimized.

FIG. 1C shows the region of interest after a planarization process is performed. The planarization process confines the dishing prevention layer or layer stack 108 and the fill layer or layer stack 106 to the recess 104 formed in the isolation region 100, The planarizing stops on the isolation region 100 outside the recess 104. Any standard planarization process such as CMP may be used to planarize the fill layer or layer stack 106.

FIG. 1D shows the region of interest after an optional processing step, After the fill layer or layer stack 106 is planarized and confined to the recess 104 formed in the isolation region 100 as shown in FIG. 1C, the isolation region 100 may be thinned outside the recess 104 and the dishing prevention layer or layer stack 108 may be removed to expose the fill layer or layer stack 106 confined to the recess 104. Any standard thinning and etching processes may be used to thin the isolation region 100 outside the recess 104 and remove the dishing prevention layer or layer stack 108.

Figure 1F:
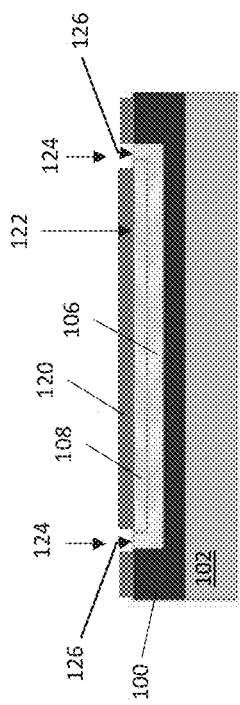
Figure 1E:
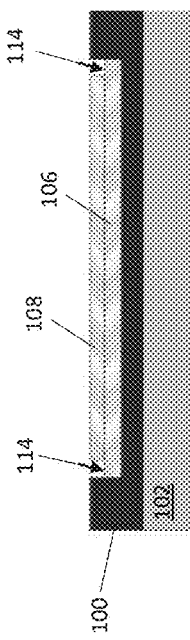

If the dishing prevention layer or layer stack 108 is to be removed from the recess 104 formed in the isolation region 100, FIG. 1E shows another optional processing step in which the fill layer or layer stack 106 confined to the recess 104 is etched in edge regions 114 to have a planar surface 116 within the recess 104 as shown in FIG. 1D. The isolation region 100 may also be recessed to have an outer surface 118 that is coplanar with the planar top surface 116 of the fill layer or layer stack 106 confined to the recess 104 also as shown in FIG. 1D The recess etch of the isolation region 100 and the removal of the dishing prevention layer or layer stack 108 may be performed simultaneously or at different times.

The fill layer or layer stack 106 confined to the recess 104 in the isolation region 100 may be used to implement an active or passive device. Depending on the type of device, one or more electrical contacts may be formed to the fill layer or layer stack 106 confined to the recess 104, to make electrical contact with the device. For example, FIG. 1F shows an approach in which a dielectric layer 120 is formed over the isolation region 100 and contacts a top surface 122 of the dishing prevention layer or layer stack 108 confined to the recess 104. Contact openings 124 formed in the dielectric layer 120 e.g. by etching extend through the dielectric layer 120 in a periphery region of the recess 104. The contact openings 124 expose a section of the fill layer or layer stack 106 which has a top surface 126 that is approximately coplanar with the top surface 122 of the dishing prevention layer or layer stack 108 in the periphery region of the recess 104. An electrically conductive material may then be formed on the dielectric layer 120 and which fills the contact openings 124 to make electrical contact with the fill layer or layer stack 106 in the periphery region of the recess 104.

FIGS. 2 through 5 illustrate embodiments of different device types implemented using the fill layer or layer stack 106 confined to the recess 104 in the isolation region 100. FIGS. 2 through 5 are partial cross-sectional views of the respective semiconductor devices, with emphasis placed on the device implemented by the fill layer or layer stack confined to the recess. Other structures and devices included in the respective semiconductor devices are out of view in FIGS. 2 through 5 for ease of illustration.

Figure 2:
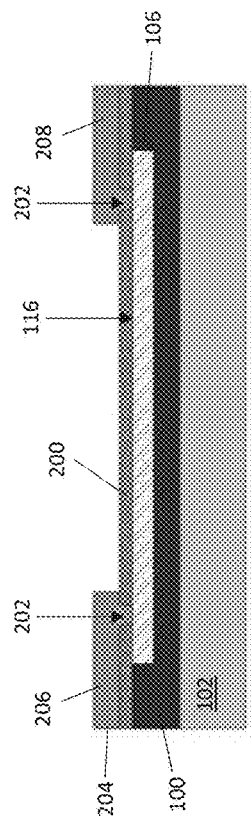

FIG. 2 illustrates an embodiment in which the fill layer or layer stack 106 confined to the recess 104 in the insulation region 100 forms a resistor. For example, the planarized material 106 in the recess 104 may comprise a metal such as Al, Cu, etc., or a semiconductor such as low-doped edge termination polysilicon, amorphous silicon, etc. A dielectric layer 200 is formed over the thinned isolation region 100 and contacts the top surface 116 of the fill layer or layer stack 106 confined to the recess 104. Contact openings 202 are formed which extend through the dielectric layer 200 to the fill layer or layer stack 106 confined to the recess 104. The spacing of the contact openings 202 at least partly determines the overall resistance of the resistor implemented by the fill layer or layer stack 106 confined to the recess 104, An electrically conductive material 204 such as metal (e.g. Al, Cu, etc.), highly doped polysilicon, etc. is formed on the dielectric layer 200. The electrically conductive material 204 fills the contact openings 202 to make electrical contact with the resistor implemented by the fill layer or layer stack 106 confined to the recess 104. The electrically conductive material 204 is patterned to form terminals 206, 208 of the resistor.

Figure 3:
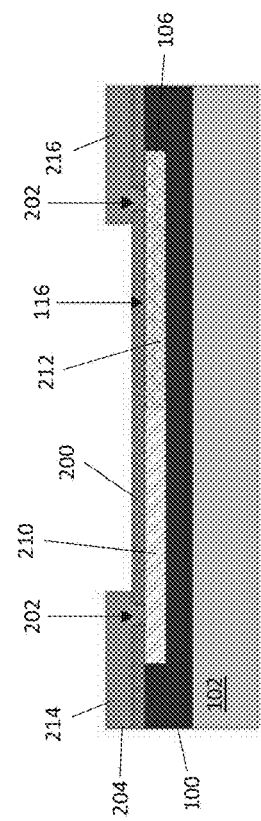

FIG. 3 illustrates an embodiment in which the material 106 confined to the recess 104 in the insulation region 100 is a semiconductor used to implement a pn junction. The semiconductor 106 includes an n-type region 210 adjacent a p-type region 212 in the recess 104. The semiconductor 106 may be doped n-type or p-type in situ during deposition e.g. as described above in connection with FIG. 1B. The oppositely doped region may be subsequently formed by any standard masked implantation or diffusion process to complete the pn junction. In other cases, the semiconductor 106 may be undoped or only lightly doped during deposition. In these cases, the n-type and p-type regions 210, 212 of the pn junction may be formed subsequently by any standard masked implantation or diffusion process.

The resulting pn junction may be used as a diode, temperature sensor, etc. A dielectric layer 200 is formed over the thinned isolation region 100 and contacts the top surface 116 of the semiconductor 106 confined to the recess 104. Contact openings 202 are formed which extend through the dielectric layer 200 to the semiconductor 106 confined to the recess 104. At least one contact opening 202 is provided to the n-type region 210, and at least one contact opening 202 is provided to the p-type region 212. An electrically conductive material 204 such as metal (e.g. Al, Cu, etc.), highly doped polysilicon, etc. is formed on the dielectric layer 200, The electrically conductive material 204 fills the contact openings 202 to make electrical contact with the n-type and p-type regions 210, 212 of the pn junction implemented by the semiconductor 106 confined to the recess 104. The electrically conductive material 204 is patterned to form anode and cathode terminals 214, 216 of the pn junction.

Figure 4:
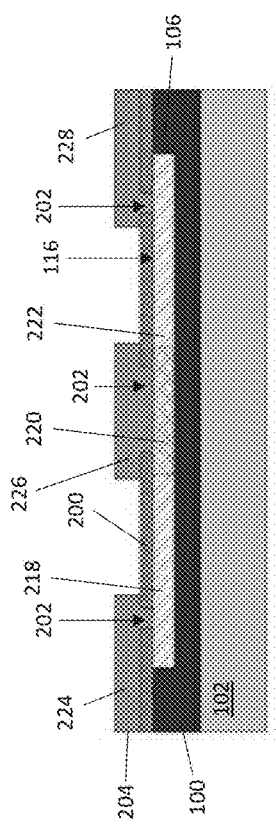
FIGS. 2 through 8 illustrate respective partial cross-sectional views of the semiconductor device with a fill layer or layer stack comprising at least one of a semiconductor or metal included in the dishing prevention structure and used to implement an active or passive device.

FIG. 4 illustrates an embodiment in which the material 106 confined to the recess 104 in the insulation region 100 is a semiconductor used to implement a bipolar transistor. The semiconductor 106 includes a collector region 218, a base region 220 and an emitter region 222. The base region 220 has the opposite doping type as the collector and emitterregions 218, 222. The semiconductor 106 may have a background doping type (e.g. n-type or p-type) provided in situ during deposition e.g. as described above in connection with FIG. 1B. For example, the semiconductor 106 may be adequately doped in situ to form the base region 220. The collector and emitter regions 218, 222 may be subsequently formed by any standard masked implantation or diffusion process. In other cases, the semiconductor 106 may be undoped or only lightly doped during deposition. In these cases, the collector, base and emitter regions 218, 220, 222 of the bipolar transistor may be formed subsequently by any standard masked implantation or diffusion process.

A dielectric layer 200 is formed over the thinned isolation region 100 and contacts the top surface 116 of the semiconductor 106 confined to the recess 104. Contact openings 202 are formed which extend through the dielectric layer 200 to the semiconductor 106 confined to the recess 104. At least one contact opening 202 is provided to the collector region 218, at least one contact opening 202 is provided to the base region 220, and at least one contact opening 202 is provided to the emitter region 222. An electrically conductive material 204 such as metal (e.g. Al, Cu, etc.), highly doped polysilicon, etc. is formed on the dielectric layer 200. The electrically conductive material 204 fills the contact openings 202 to make electrical contact with the collector, base and emitter regions 218, 220, 222 of the bipolar transistor implemented by the semiconductor 106 confined to the recess 104. The electrically conductive material 204 is patterned to form collector, base and emitter terminals 224, 226, 228 of the bipolar transistor.

Figure 5:
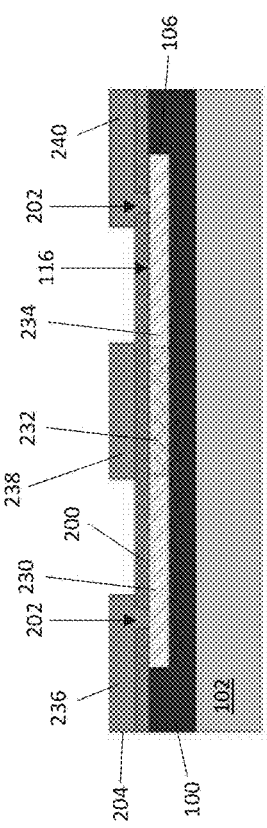

FIG. 5 illustrates an embodiment in which the material 106 confined to the recess 104 in the insulation region 100 is a semiconductor used to implement a MOSFET (metal-oxide-semiconductor field effect transistor). The semiconductor 106 includes a source region 230, a channel region 232 and a drain region 234. The channel region 232 has the opposite doping type as the source and drain regions 230, 234. The semiconductor 106 may have a background doping type (e.g. n-type or p-type) provided in situ during deposition e.g. as described above in connection with FIG. 1B. For example, the semiconductor 106 may be adequately doped to form the channel region 232 during deposition. The source and drain regions 230, 234 may be subsequently formed by any standard masked implantation or diffusion process. In other cases, the semiconductor 106 may be undoped or only lightly doped during deposition. In these cases, the source, channel and drain regions 230, 232, 234 of the MOSFET may be formed subsequently by any standard masked implantation or diffusion process.

A dielectric layer 200 is formed over the thinned isolation region 100 and contacts the top surface 116 of the semiconductor 106 confined to the recess 104. Contact openings 202 are formed which extend through the dielectric layer 200 to the semiconductor 106 confined to the recess 104. At least one contact opening 202 is provided to the source region 230 and at least one contact opening 202 is provided to the drain region 234. The channel region 232 remains protected by the dielectric layer 200, which functions as a gate dielectric in the area of the channel region 232. An electrically conductive material 204 such as metal (e.g. Al, Cu, etc.), highly doped polysilicon, etc. is formed on the dielectric layer 200. The electrically conductive material 204 fills the contact openings 202 to make electrical contact with the source and drain regions 230, 234 of the MOSFET implemented by the semiconductor 106 confined to the recess 104. The electrically conductive material 204 is patterned to form source, gate and drain terminals 236, 238, 240 of the MOSFET.

Figure 6:
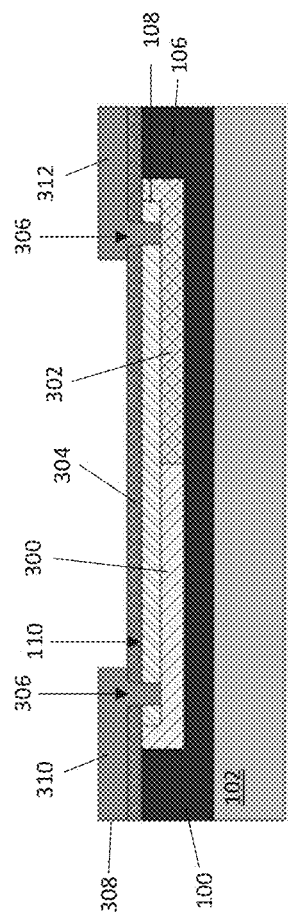
Figure 7:
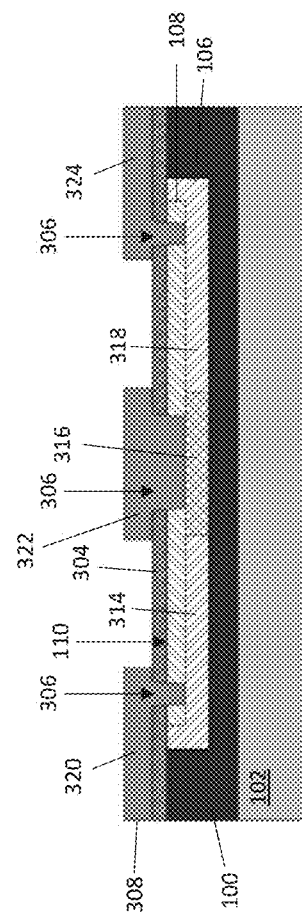
Figure 8:
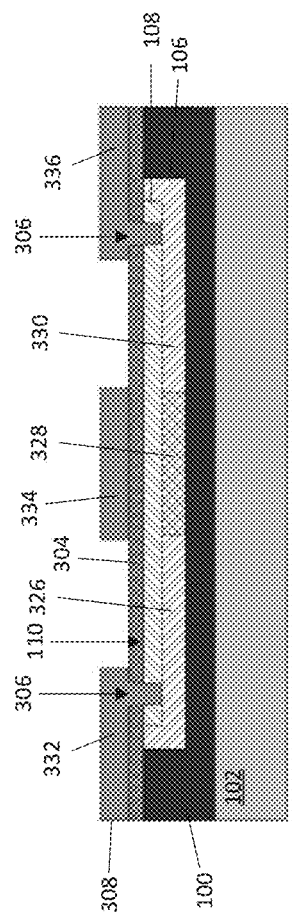

As explained above, isolation region thinning and dishing prevention layer or layer stack removing processes illustrated in FIG. 1D may be omitted. In this case, the dishing prevention layer or layer stack 108 remains part of the final device. FIGS. 6 through 8 are partial cross-sectional views of exemplary semiconductor devices in which the dishing prevention layer or layer stack 108 remains part of the final device, with emphasis placed on the device implemented by the fill layer or layer stack confined to the recess. Other structures and devices included in the respective semiconductor devices are out of view in FIGS. 6 through 8 for ease of illustration.

FIG. 6 illustrates an embodiment in which the material 106 confined to the recess 104 in the insulation region 100 is a semiconductor used to implement a pn junction. The semiconductor 106 includes an n-type region 300 adjacent a p-type region 302 in the recess 104. The semiconductor 106 may be doped n-type or p-type in situ during deposition e.g. as described above in connection with FIG. 1B, The oppositely doped region of the pn junction may be subsequently formed by any standard masked implantation or diffusion process. In other cases, the semiconductor 106 may be undoped or only lightly doped during deposition. In these cases, the n-type and p-type regions 300, 302 of the pn junction may be formed subsequently by any standard masked implantation or diffusion process.

The pn junction may be used as a diode, temperature sensor, etc. A dielectric layer 304 is formed over the isolation region 100 and contacts the top surface 110 of the dishing prevention layer or layer stack 108 confined to the recess 104 and which remains part of the final device. Contact openings 306 are formed which extend through the dielectric layer 304 and the dishing prevention layer or layer stack 108 to the semiconductor 106 confined to the recess 104. At least one contact opening 306 is provided to the n-type region 300, and at least one contact opening 306 is provided to the p-type region 302. An electrically conductive material 308 such as metal (e.g. Al, Cu, etc.), highly doped polysilicon, etc. is formed on the dielectric layer 304. The electrically conductive material 308 fills the contact openings 306 to make electrical contact with the n-type and p-type regions 300, 302 of the pn junction implemented by the semiconductor 106 confined to the recess 104. The electrically conductive material 308 is patterned to form anode and cathode terminals 310, 312 of the pn junction.

FIG. 7 illustrates an embodiment in which the material 106 confined to the recess 104 in the insulation region 100 is a semiconductor used to implement a bipolar transistor. The semiconductor 106 includes a collector region 314, a base region 316 and an emitter region 318. The base region 316 has the opposite doping type as the collector and emitter regions 314, 318. The semiconductor 106 may have a background doping type (n-type or p-type) provided in situ during deposition e.g. as described above in connection with FIG. 1B. For example, the semiconductor 106 may be adequately doped to form the base region 316 during deposition. The collector and emitter regions 314, 318 may be subsequently formed by any standard masked implantation or diffusion process. In other cases, the semiconductor 106 may be undoped or only lightly doped during deposition. In these cases, the collector, base and emitter regions 314, 316, 318 of the bipolar transistor may be formed subsequently by any standard masked implantation or diffusion process.

A dielectric layer 304 is formed over the isolation region 100 and contacts the top surface 110 of the dishing prevention layer or layer stack 108 confined to the recess 104 and which remains part of the final device. Contact openings 306 are formed which extend through the dielectric layer 304 and the dishing prevention layer or layer stack 108 to the semiconductor 106 confined to the recess 104. At least one contact opening 306 is provided to the collector region 314, at least one contact opening 306 is provided to the base region 316, and at least one contact opening 306 is provided to the emitter region 318. An electrically conductive material 308 such as metal (e.g. Al, Cu, etc.), highly doped polysilicon, etc, is formed on the dielectric layer 304. The electrically conductive material 308 fills the contact openings 306 to make electrical contact with the collector, base and emitter regions 314, 316318 of the bipolar transistor implemented by the semiconductor 106 confined to the recess 104. The electrically conductive material 308 is patterned to form collector, base and emitter terminals 320, 322, 324 of the bipolar transistor.

FIG. 8 illustrates an embodiment in which the material 106 confined to the recess 104 in the insulation region 100 is a semiconductor used to implement a MOSFET (metal-oxide-semiconductor field effect transistor). The semiconductor 106 includes a source region 326, a channel region 328 and a drain region 330. The channel region 328 has the opposite doping type as the source and drain regions 326, 330. The semiconductor 106 may have a background doping type (n-type or p-type) provided in situ during deposition e.g. as described above in connection with FIG. 1B. For example, the semiconductor 106 may be adequately doped to form the channel region 328 during deposition. The source and drain regions 326, 330 may be subsequently formed by any standard masked implantation or diffusion process. In other cases, the semiconductor 106 may be undoped or only lightly doped during deposition. In these cases, the source, channel and drain regions 326, 328, 330 of the MOSFET may be formed subsequently by any standard masked implantation or diffusion process.

A dielectric layer 304 is formed over the isolation region 100 and contacts the top surface 110 of the dishing prevention layer or layer stack 108 confined to the recess 104 and which remains part of the final device. Contact openings 306 are formed which extend through the dielectric layer 304 and the dishing prevention layer or layer stack 108 to the semiconductor 106 confined to the recess 104. At least one contact opening 306 is provided to the source region 326 and at least one contact opening 306 is provided to the drain region 330. The channel region 328 remains covered by the dielectric layer 304 and the dishing prevention layer or layer stack 108, which together function as a gate dielectric in the area of the channel region 328. The dishing prevention layer or layer stack 108 may be removed over the channel region 328, so that only the dielectric layer 304 functions as the gate dielectric in over this region 328. An electrically conductive material 308 such as metal (e.g. Al, Cu, etc.), highly doped polysilicon, etc. is formed on the dielectric layer 304. The electrically conductive material 308 fills the contact openings 306 to make electrical contact with the source and drain regions 326, 330 of the MOSFET implemented by the semiconductor 106 confined to the recess 104. The electrically conductive material 308 is patterned to form source, gate and drain terminals 332, 334, 336 of the MOSFET.

Figure 9:
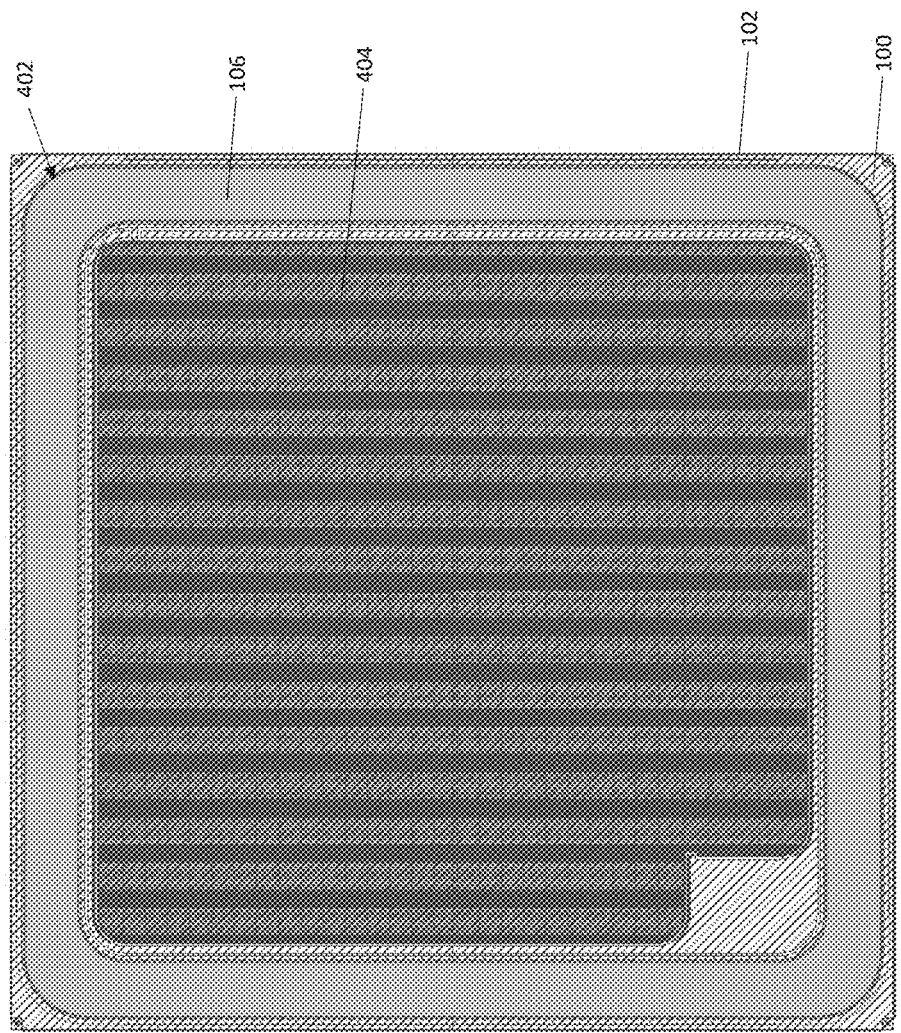
FIG. 9 illustrates a plan view of the semiconductor device with a fill layer or layer stack comprising at least one of a semiconductor or metal included in the dishing prevention structure and formed as a ring.

FIG. 9 illustrates an embodiment of a semiconductor die 400 in which the fill layer or layer stack 106 confined to the recess 104 in the insulation region 100 forms a ring 402 that surrounds the periphery of the substrate 102 in an edge termination region. Active devices such as transistors are formed in a region of the substrate 102 spaced inward from the ring 402. Electrodes such as source/emitter, drain/collector and gate electrodes may be formed at one or both sides of the die 400. For example, one such electrode 404 is shown in FIG. 9 spaced inward from the ring 402 formed by the fill layer or layer stack 106 confined to the recess 104 in the insulation region 100.

FIGS. 10A through 10F illustrate yet another embodiment of a method of manufacturing a semiconductor device that includes planarizing a structure with wide dimensions, FIGS. 10A through 10F are partial cross-sectional views, with emphasis placed on the dishing prevention structure and related process steps. Other structures and devices included in the semiconductor device are out of view in FIGS. 1A through 1F for ease of illustration.

FIG. 10A shows a substrate 500. In some cases, the substrate 500 may be a semiconductor substrate. In other cases, the substrate 500 may be a glass substrate. Still other types of substrates may be used. In the case of a semiconductor substrate, the substrate 500 may comprise any type of semiconductor material such as a single element semiconductor (e.g. Si, Ge, etc.), silicon-on-insulator, a binary semiconductor (e.g. SIC, GaN, GaAs, etc.), a ternary semiconductor, etc. with or without epitaxial layer(s).

FIG. 10B shows a recess 502 formed in the substrate 500. Any standard trench formation process such as etching may be used to form the recess 502. The recess 502 has relatively large dimensions and thus would be prone to dishing after being filled, if a conventional planarization process were to be used. For example, the recess 502 may have a width (w_rec) above 50 µm, 50 to 100 µm, 300 µm or even wider. The depth (d_rec) of the recess 502 is less than the width, e.g. 100 nm to 2 µm, or deeper or shallower. In some embodiments, the recess 502 is in the form of a ring that surrounds the periphery of the substrate 500 in an edge termination region.

FIG. 10C shows an insulating layer 504 such as a dielectric and/or oxide formed on the substrate 500 and which conforms to the recess 502. In one embodiment, the insulating layer 504 is a thermal oxide formed by forcing an oxidizing agent to diffuse into the substrate 500 at high temperature and react with the substrate 500. For example, the insulating layer 504 may be formed as part of a common gate dielectric process in which a gate dielectric is formed in other parts of the substrate 500 e.g. as part of forming a transistor device.

FIG. 10D shows a fill layer or layer stack 506 comprising at least one of a semiconductor or metal formed on the insulating layer 504. The fill layer or layer stack 506 conforms to the recess 502. In the case of a metal, one or more metal layers may be conformally deposited on the insulating layer 504. For example, an aluminum metallization layer may be conformally deposited on the insulating layer 504. In another example, a barrier layer, a seed layer and a copper metallization layer each may be conformally deposited on the insulating layer 504. In the case of a semiconductor, the semiconductor material may be doped or undoped. The semiconductor may be doped in situ during conformal deposition on the insulating layer 504, or subsequently doped. The semiconductor may have regions of different doping types in the recess 502 (e.g. n-type and p-type regions). The semiconductor may be low-doped edge termination polysilicon, amorphous silicon, highly doped polysilicon (e.g, of the kind used to form gate electrodes in other regions of the device), polysilicon-germanium, an epitaxial layer, etc.

FIG. 10E shows a dishing prevention layer or layer stack 508 formed on the fill layer or layer stack 506 and which conforms to the recess 502. The dishing prevention layer or layer stack 508 minimizes or at least reduces dishing when planarizing the fill layer or layer stack 506 formed on the insulating layer 504 and in the recess 502. In one embodiment, the dishing prevention layer or layer stack 508 comprises one or more of silicon oxide, silicon nitride and silicon oxynitride. The dishing prevention layer or layer stack 508 may comprise the same material as the insulating layer 504 to function as an effective etch stop. In the case of planarization by CMP, the dishing prevention layer or layer stack 508 may comprise a material or combination of materials suitable as an effective etch stop for CMP. In one embodiment, the layer 506 to be planarized and the dishing prevention layer or layer stack 508 are blanket deposited everywhere over the substrate 500. In an embodiment, the thickness of the fill layer or layer stack 506 formed on the insulating layer 504 and the thickness of the dishing prevention layer or layer stack 508 are chosen such that the top (uppermost) surface 510 of the dishing prevention layer or layer stack 508 in the recess 502 is coplanar or nearly coplanar with the top surface 512 of the insulating layer 504 outside the recess 502. This way, post-planarization residue on both sides of the recess structure and inside the recess structure is minimized.

FIG. 10F shows the dishing prevention layer or layer stack 508 and the fill layer or layer stack 506 after planarization, e.g. by CMP. After planarization, the dishing prevention layer or layer stack 508 and the fill layer or layer stack 506 are confined to the recess 502 formed in the substrate 500. The planarizing stops on the insulating layer 504 outside the recess 502. The dishing prevention layer or layer stack 508 may remain in the final device or be removed, as previously explained herein in connection with FIG. 1D, If the dishing prevention layer or layer stack 508 is to be removed from the recess 502 formed in the substrate 500, the fill layer or layer stack 506 confined to the recess 502 may be etched to have a planar surface within the recess 502 e.g. as previously explained herein in connection with FIG. 1E.

One or more electrical contacts may be formed to the fill layer or layer stack 506 confined to the recess 502, also as previously explained herein. For example, if the dishing prevention layer or layer stack 508 is to remain in the final device, the electrical contacts to the fill layer or layer stack 506 confined to the recess 502 may be formed by forming a dielectric layer over the insulating layer 504 and which contacts a top surface 510 of the dishing prevention layer or layer stack 508 confined to the recess 502, forming contact openings which extend through the dielectric layer and the dishing prevention layer or layer stack 508 to the fill layer or layer stack 506 confined to the recess 502, and forming an electrically conductive material on the dielectric layer and which fills the contact openings to make electrical contact with the fill layer or layer stack 506 confined to the recess 502 (similar to what is shown in and described for any of FIGS. 6 through 8).

After the planarizing, the insulating layer 504 instead may be removed outside the recess 502 and the dishing prevention layer or layer stack 508 may be removed altogether to expose the fill layer or layer stack 506 confined to the recess 502. In this case, electrical contacts to the fill layer or layer stack 506 confined to the recess 502 are formed by forming a dielectric layer over the substrate 500 and contacting the top surface of the fill layer or layer stack 506 confined to the recess 502, forming contact openings which extend through the dielectric layer to the fill layer or layer stack 506 confined to the recess 502, and forming an electrically conductive material on the dielectric layer and which fills the contact openings to make electrical contact with the fill layer or layer stack 506 confined to the recess 502 (similar to what is shown in and described for any of FIGS. 2 through 5). In each case, the fill layer or layer stack 506 confined to the recess 502 formed in the substrate 500 may be used to implement a passive or active device such as a resistor, pn junction, temperature sensor, bipolar transistor, MOSFET, etc., as previously explained herein.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of manufacturing a semiconductor device, the method comprising:
   forming an isolation region comprising a dielectric material on a substrate;
   forming a recess in the isolation region, wherein a thickness of the isolation region is reduced but greater than zero in the recess;
   forming a fill layer or layer stack comprising at least one of a semiconductor and metal on the isolation region and which conforms to the recess;
   forming a dishing prevention layer or layer stack on the fill layer or layer stack and which conforms to the recess;
   planarizing the dishing prevention layer or layer stack and the fill layer or layer stack to confine the dishing prevention layer or layer stack and the fill layer or layer stack to the recess, wherein the planarizing stops on the isolation region outside the recess; and
   forming one or more electrical contacts to the fill layer or layer stack confined to the recess.

2. The method of claim 1, further comprising:
   forming one or more contact openings which extend through the dishing prevention layer or layer stack and to the fill layer or layer stack in the recess.

3. The method of claim 1, wherein forming the fill layer or layer stack on the isolation region comprises:
   depositing doped or undoped polysilicon on the isolation region and which conforms to the recess.

4. The method of claim 1, further comprising:
   after the planarizing, thinning the isolation region outside the recess and removing the dishing prevention layer or layer stack to expose the fill layer or layer stack confined to the recess.

5. The method of claim 4, wherein forming the one or more electrical contacts to the fill layer or layer stack confined to the recess comprises:
   forming a dielectric layer over the thinned isolation region and contacting a top surface of the exposed fill layer or layer stack confined to the recess;
   forming contact openings which extend through the dielectric layer to the fill layer or layer stack confined to the recess; and
   forming an electrically conductive material on the dielectric layer and which fills the contact openings to make electrical contact with the fill layer or layer stack confined to the recess.

6. The method of claim 4, further comprising:
   recess etching the fill layer or layer stack confined to the recess so that the fill layer or layer stack has a planar surface within the recess.

7. The method of claim 1, wherein forming the one or more electrical contacts to the fill layer or layer stack confined to the recess comprises:
   forming a dielectric layer over the isolation region and contacting a top surface of the dishing prevention layer or layer stack confined to the recess;
   forming contact openings which extend through the dielectric layer and the dishing prevention layer or layer stack to the fill layer or layer stack confined to the recess; and
   forming an electrically conductive material on the dielectric layer and which fills the contact openings to make electrical contact with the fill layer or layer stack confined to the recess.

8. The method of claim 1, wherein the fill layer or layer stack confined to the recess is a doped semiconductor material, the method further comprising:
   forming an active device in the doped semiconductor material and confined to the recess.

9. The method of claim 1, wherein a top surface of the dishing prevention layer or layer stack in the recess is approximately coplanar with a top surface of the isolation region outside the recess.

10. The method of claim 1, wherein forming the one or more electrical contacts to the fill layer or layer stack confined to the recess comprises:
    forming a dielectric layer over the isolation region and contacting a top surface of the dishing prevention layer or layer stack confined to the recess;
    forming contact openings which extend through the dielectric layer in a periphery region of the recess; and
    forming an electrically conductive material on the dielectric layer and which fills the contact openings to make electrical contact with the fill layer or layer stack in the periphery region of the recess.

11. A method of manufacturing a semiconductor device, the method comprising:
    forming a recess in a substrate;
    forming an insulating layer on the substrate and which conforms to the recess;
    forming a fill layer or layer stack comprising at least one of a semiconductor or metal on the insulating layer and which conforms to the recess;
    forming a dishing prevention layer or layer stack on the fill layer or layer stack and which conforms to the recess;

planarizing the dishing prevention layer or layer stack and the fill layer or layer stack to confine the dishing prevention layer or layer stack and the fill layer or layer stack to the recess, wherein the planarizing stops on the insulating layer outside the recess; and forming one or more electrical contacts to the fill layer or layer stack confined to the recess.

12. The method of claim 11, further comprising:
forming one or more contact openings which extend through the dishing prevention layer or layer stack and to the fill layer or layer stack in the recess.

13. The method of claim 11, wherein forming the fill layer or layer stack on the insulating layer comprises:
depositing doped or undoped polysilicon on the insulating layer and which conforms to the recess.

14. The method of claim 11, further comprising:
after the planarizing, removing the insulating layer outside the recess and removing the dishing prevention layer or layer stack to expose the fill layer or layer stack confined to the recess.

15. The method of claim 14, wherein forming the one or more electrical contacts to the fill layer or layer stack confined to the recess comprises:
forming a dielectric layer over the substrate and contacting a top surface of the exposed fill layer or layer stack confined to the recess;
forming contact openings which extend through the dielectric layer to the fill layer or layer stack confined to the recess; and
forming an electrically conductive material on the dielectric layer and which fills the contact openings to make electrical contact with the fill layer or layer stack confined to the recess.

16. The method of claim 11, further comprising:
recess etching the fill layer or layer stack confined to the recess so that the fill layer or layer stack has a planar surface within the recess.

17. The method of claim 11, wherein forming the one or more electrical contacts to the fill layer or layer stack confined to the recess comprises:
forming a dielectric layer over the insulating layer and contacting a top surface of the dishing prevention layer or layer stack confined to the recess;
forming contact openings which extend through the dielectric layer and the dishing prevention layer or layer stack to the fill layer or layer stack confined to the recess; and
forming an electrically conductive material on the dielectric layer and which fills the contact openings to make electrical contact with the fill layer or layer stack confined to the recess.

18. The method of claim 11, wherein the fill layer or layer stack confined to the recess is a doped semiconductor material, the method further comprising:
forming an active device in the doped semiconductor material and confined to the recess.

19. The method of claim 11, wherein a top surface of the dishing prevention layer or layer stack in the recess is approximately coplanar with a top surface of the insulating layer outside the recess.

20. The method of claim 11, wherein forming the one or more electrical contacts to the fill layer or layer stack confined to the recess comprises:
forming a dielectric layer over the insulating layer and contacting a top surface of the dishing prevention layer or layer stack confined to the recess;
forming contact openings which extend through the dielectric layer in a periphery region of the recess; and
forming an electrically conductive material on the dielectric layer and which fills the contact openings to make electrical contact with the fill layer or layer stack in the periphery region of the recess.

21. A semiconductor device, comprising:
a substrate;
an isolation region comprising a dielectric material on the substrate;
a recess in the isolation region;
a semiconductor material confined to the recess; and
an active or passive device formed in the semiconductor material and confined to the recess,
wherein a thickness of the isolation region is reduced but greater than zero in the recess.

22. The semiconductor device of claim 21, wherein a top surface of the semiconductor material is approximately coplanar with a top surface of the isolation region.

23. The semiconductor device of claim 22, further comprising:
a dielectric layer over the isolation region and contacting the top surface of the semiconductor material confined to the recess;
contact openings formed in the dielectric layer which extend to the semiconductor material confined to the recess; and
an electrically conductive material on the dielectric layer and which fill the contact openings in the dielectric layer to make electrical contact with the active or passive device formed in the semiconductor material confined to the recess.

24. The semiconductor device of claim 21, further comprising a dishing prevention layer or layer stack formed on the semiconductor material and confined to the recess, wherein the dishing prevention layer or layer stack has a top surface that is approximately coplanar with a top surface of the isolation region.

25. The semiconductor device of claim 24, further comprising:
a dielectric layer over the isolation region and contacting the top surface of the dishing prevention layer or layer stack confined to the recess;
contact openings formed in the dielectric layer and the dishing prevention layer or layer stack which extend to the semiconductor material confined to the recess; and
an electrically conductive material on the dielectric layer and which fill the contact openings in the dielectric layer and the dishing prevention layer or layer stack to make electrical contact with the active or passive device formed in the semiconductor material confined to the recess.

26. The semiconductor device of claim 21, wherein the recess in the isolation region is in the form of a ring that surrounds a periphery of the substrate in an edge termination region.

* * * * *